United States Patent
Danning

(10) Patent No.: US 10,355,636 B2
(45) Date of Patent: Jul. 16, 2019

(54) STRUCTURE AND SUPPORT DEVICE FOR PHOTOVOLTAIC ARRAYS

(71) Applicant: Everest Solar Systems LLC, Oceanside, CA (US)

(72) Inventor: Matthew Danning, Oakland, CA (US)

(73) Assignee: Everest Solar Systems LLC, Oceanside, CA (US)

(*) Notice: Subject to any disclaimer, the term of this patent is extended or adjusted under 35 U.S.C. 154(b) by 0 days.

(21) Appl. No.: 15/653,659

(22) Filed: Jul. 19, 2017

(65) Prior Publication Data

US 2018/0026576 A1    Jan. 25, 2018

Related U.S. Application Data

(60) Provisional application No. 62/365,062, filed on Jul. 21, 2016, provisional application No. 62/371,924, filed on Aug. 8, 2016.

(51) Int. Cl.
*H02S 20/23* (2014.01)
*F24S 20/67* (2018.01)
(Continued)

(52) U.S. Cl.
CPC ............... *H02S 20/23* (2014.12); *F16B 5/12* (2013.01); *F24S 20/67* (2018.05); *F24S 25/16* (2018.05); *F24S 25/20* (2018.05); *F24S 25/61* (2018.05); *F24S 25/67* (2018.05); *F24S 40/85* (2018.05); *H01L 31/042* (2013.01); *H02S 30/00* (2013.01); *F16B 2/22* (2013.01); *F16B 5/065* (2013.01); *F16B 5/123* (2013.01); *F24S 2025/6004* (2018.05); *F24S 2025/6007* (2018.05); *Y02B 10/12* (2013.01); *Y02E 10/47* (2013.01); *Y02E 10/50* (2013.01)

(58) Field of Classification Search
CPC . F24S 25/61; F24S 25/67; F24S 40/85; H02S 20/23
See application file for complete search history.

(56) References Cited

U.S. PATENT DOCUMENTS

| 4,261,330 A | 4/1981 | Reinisch |
| 10,069,455 B2 * | 9/2018 | Corio .................. H02G 3/02 |

(Continued)

FOREIGN PATENT DOCUMENTS

| DE | 102010002751 A1 * | 9/2011 | ............ H02S 20/23 |
| EP | 2416084 A2 * | 2/2012 | ............ F24S 40/80 |

(Continued)

OTHER PUBLICATIONS

International Search Report/Written Opinion released by the U.S. Patent & Trademark Office as International Search Authority dated Nov. 21, 2017; 13 pages.

*Primary Examiner* — Christine T Cajilig
(74) *Attorney, Agent, or Firm* — Smith Gambrell & Russell, LLP; Matthew Warenzak

(57) ABSTRACT

A structure and support device for photovoltaic arrays is provided. The device provides a structural connection between photovoltaic modules, wind deflectors and similar hardware. The invention provides an advantage of quick and easy installation of hardware components and associated parts, and meets the demand for a single device capable of combining solar energy associated hardware into photovoltaic arrays.

19 Claims, 6 Drawing Sheets

(51) Int. Cl.
*F24S 25/20* (2018.01)
*F16B 5/12* (2006.01)
*H01L 31/042* (2014.01)
*F24S 25/16* (2018.01)
*H02S 30/00* (2014.01)
*F24S 25/60* (2018.01)
*F24S 25/61* (2018.01)
*F24S 25/67* (2018.01)
*F24S 40/80* (2018.01)
*F16B 2/22* (2006.01)
*F16B 5/06* (2006.01)

(56) References Cited

U.S. PATENT DOCUMENTS

| | | | | |
|---|---|---|---|---|
| 2005/0241246 | A1* | 11/2005 | Sinha | H02S 20/23 |
| | | | | 52/173.3 |
| 2011/0260027 | A1* | 10/2011 | Farnham, Jr. | F24J 2/5207 |
| | | | | 248/309.1 |
| 2011/0278411 | A1* | 11/2011 | Carbonare | F24J 2/5239 |
| | | | | 248/237 |
| 2013/0015303 | A1* | 1/2013 | Gies | H02S 20/00 |
| | | | | 248/176.1 |
| 2016/0285407 | A1* | 9/2016 | De Vogel | H02S 20/24 |
| 2018/0031279 | A1* | 2/2018 | Haddock | F24S 25/615 |

FOREIGN PATENT DOCUMENTS

| | | | | |
|---|---|---|---|---|
| WO | WO2013009894 | | 1/2013 | |
| WO | WO2008021714 | | 1/2014 | |
| WO | WO-2015069112 A1 * | | 5/2015 | H02S 20/24 |

* cited by examiner

STRUCTURE AND SUPPORT DEVICE FOR PHOTOVOLTAIC ARRAYS

CROSS REFERENCE TO RELATED APPLICATIONS

This application claims priority to U.S. Provisional Patent Application No. 62/365,062, filed on Jul. 21, 2016, and U.S. Provisional Patent Application No. 62/371,924, filed Aug. 8, 2016, both of which are relied upon and incorporated herein in their entirety by reference.

FIELD OF INVENTION

This invention generally relates to photovoltaic arrays, and more particularly to a structure and support device for photovoltaic (PV) arrays and associated hardware.

BACKGROUND OF THE INVENTION

A photovoltaic (PV) installation typically includes a collection of photovoltaic modules combined and placed in a support structure that houses each of the photovoltaic components to form a photovoltaic array. Typically, photovoltaic arrays are placed in an outdoor location to be exposed to sunlight and wind conditions. To promote optimal collection of solar energy, PV modules are mostly installed with an angled/tilted orientation. Further, because PV modules may become damaged by extreme weather conditions, wind deflectors are routinely installed aside to prevent wind from penetrating underneath the PV array. Installing optimally oriented PV modules and associated wind deflection devices often requires a significant number of hardware components to effectively combine and secure the PV modules in a PV array. Installing a significant number of hardware components is often costly and time consuming.

Given the aforementioned challenges, it is desirable to have a single hardware component that may be used for combining PV modules and associated components in PV arrays.

SUMMARY OF THE INVENTION

Photovoltaic (PV) arrays routinely require hardware to support construction and installation. Embodiments of the present invention provide a structure and support device for use with PV arrays and wind deflectors that reduces the cost and time associated with installation of both components.

In an embodiment of the present invention, a structure and support device is provided. The structure and support device features attachment components and surface areas for securing multiple PV modules, wind deflectors and/or similar hardware in a PV array.

These and other objects and advantages of the invention will become apparent from the following detailed description of the preferred embodiment of the invention. Both the foregoing general description and the following detailed description are exemplary and explanatory only and are intended to provide further explanation of the invention as claimed.

The accompanying drawings are included to provide a further understanding of the invention and are incorporated in and constitute part of this specification, illustrate several embodiments of the invention that together with the description serve to explain the principles of the invention.

DETAILED DESCRIPTION OF THE INVENTION

Embodiments of the invention will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

In the following description, numerous specific details are set forth. However, it is to be understood that embodiments of the invention may be practiced without these specific details. In other instances, well-known methods, structures and techniques have been shown in detail in order not to obscure an understanding of this description.

The present invention, as shown in FIGS. 1-7, is directed towards a structure and support device 100/300. The structure and support device 100/300 is configured to provide structure and support to components, including, but not limited to photovoltaic panels/modules, racking components, wind deflectors, ballast pans, roof anchors, and the like commonly used in solar mounting systems. In an aspect, the structure and support device 100/300 can be constructed from aluminum extrusion. In another aspect, the device 100/300 can be constructed from welded aluminum, welded steel, laid-up fiberglass, injection molded plastic or any other suitable method and material know in the art that is durable and can prevent failing from exposure to natural elements.

Figure 1:
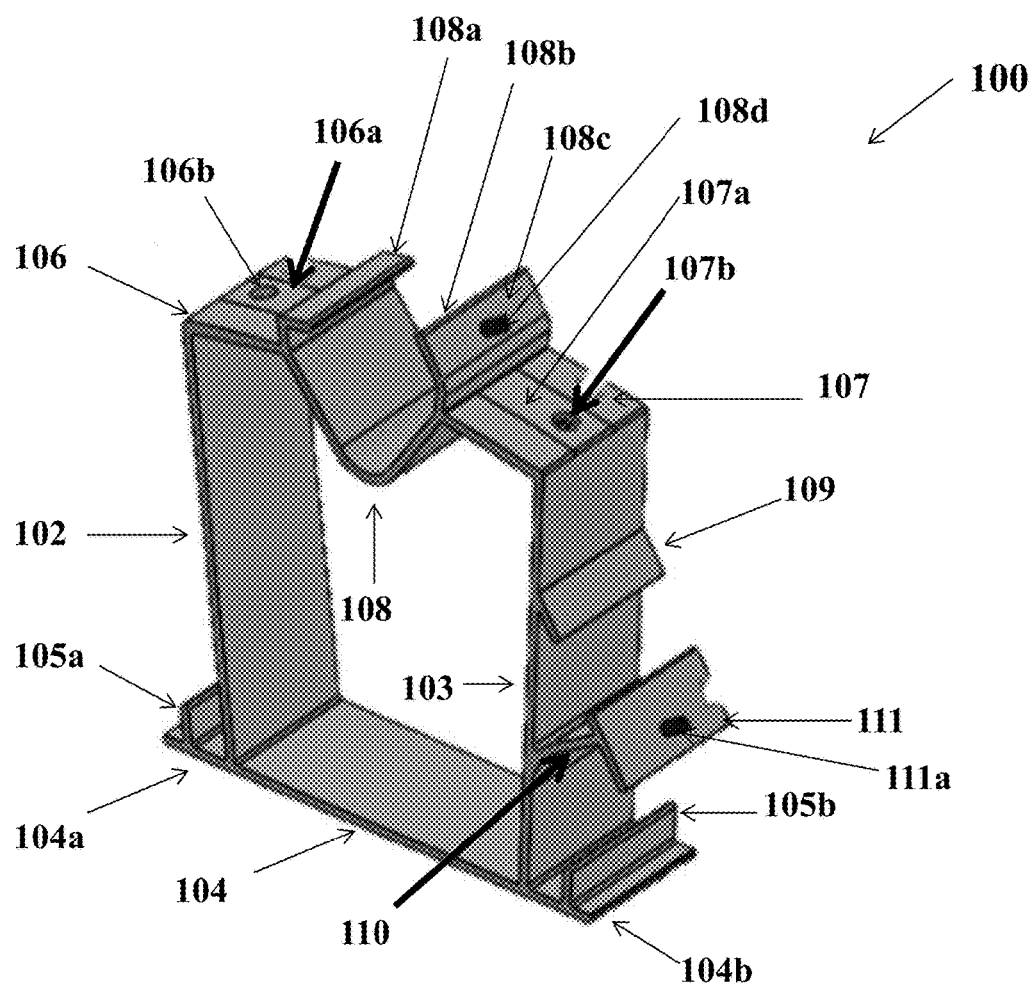
FIG. 1 is a top perspective view of a structure and support device for photovoltaic arrays according to aspects of the present invention.

In an aspect, as illustrated in FIGS. 1-5, the structure and support device 100 comprises a semi-rectangular frame formed from two side members 102 and 103 extending vertically upward from a base 104 in a slightly angled fashion outwardly away from one another, as shown in FIG. 1. In an exemplary aspect, the side members 102 and 103 are oriented at an angle that corresponds to the lowest practical wind speeds as determined in wind tunnel testing. The base 104 provides a support surface for the device 100 when installed atop roofs or similar locations due to the weight/force of associated components (e.g. PV modules). In an aspect, the structure and support device 100 is secured to a mounting surface via the base 104. In an aspect, the structure and support device 100 can be ballasted in place with commonly available concrete blocks. In another aspect, the structure and support device 100 can be anchored to a roof using known fastening means, including, but not limited to, brackets, fasteners, bolts, and the like. The structure and support device 100 features stabilizers 104a and 104b that extend, respectively, from the left and right sides of the base 104. In an aspect, stabilizers 104a and 104b feature intersecting members 105a and 105b that are perpendicular to the stabilizers 104a and 104b. In an aspect, the intersecting members 105a and 105b can be used to attach railing components, mountings, racking components, ballast support, roof anchors, or any other similar hardware know in the art.

The top portion of the device 100 features two equal length, angled inward, members 106 and 107. The members 106 and 107, oriented in a substantially horizontal position, both feature raised module interfaces 106a and 107a in their respective centers that run the length of the horizontal members 106 and 107. The module interfaces 106a and 107a provide a surface area to which PV modules abut/contact when combined into a PV array. The surface area of the module interfaces 106a and 107a helps to restrict movement of the PV modules and provide structural integrity to the overall construction of a PV array. In addition to the restriction, the surface area of the module interfaces 106a and 107a aids in locally stabilizing the array during installation before the PV modules are permanently attached. The module interfaces 106a and 107a each feature apertures 106b and 107b that are configured to receive fasteners used to secure the PV modules. The apertures 106b, 107b receive nuts or studs, or extruded features that are designed to interface with existing or future module clamps or other securing fasteners.

The angled members 106 and 107 interact with a center structure 108 centered in the top portion of the member 100. In an aspect, the center structure 108 is V-shaped, forming a roof-like structure for the member 100. The V-shaped center structure 108 is configured to hold wiring or for cable management of hardware or trays. In other embodiments, the center structure 108 can feature any other shape suitable to enable desired orientation of PV modules, wind deflectors and/or associated components. In other embodiments, the center structure 108 of the structure and support device 100 can have other shapes.

The center structure 108 features arms 108a and 108b that extend above the angled members 106 and 107. In an aspect, one arm 108b features an angled, flat surface area 108c with a protrusion/stud 108d extending from its center. In an aspect, the protrusion/stud 108d can be a threaded stud 108d received by a hole (not shown) in the flat surface area 108c. In other aspects, the protrusion/stud 108d can be an extruded feature into which a screw or snap-on fastener or connector is inserted. In other embodiments, the arm 108a can also feature a flat surface area with a protrusion/stud extending from the surface area. In an aspect, the protrusion/stud 108d is centered in the middle of the surface area 108c; however, it can be oriented in a variety of locations as deemed desirable. The surface area (e.g. 108c) provides a contact area to which a wind deflector 200 (FIG. 2) may rest/abut while being held in place by the protrusion/peg (e.g. 108d). The protrusion/stud 108d is configured to mate with a slot 200a (FIG. 2), or any similar structure typically found on wind deflectors or related components, such that the mating of the protrusion/stud 180d and slot 200a, and in some cases another securing means, secures the wind deflector in place. In an aspect, the stud 108d can be threaded, with a nut and bolt being used as the other securing means. In other embodiments, hitch pins, push-on fasteners, and the like can be used.

In an aspect, one of the side members 103 features a first extension 109. In an aspect, the first extension 109 can be a rectangular flat-surface extension 109, the flat-surface extension 109 located approximately two-thirds along the length of the side member 103 from the base 104. The rectangular flat-surface extension 109 extends from the side member 103 angled at a degree complimentary to the angled flat surface area 108c. The rectangular flat-surface extension 109 provides a contact area to support a wind deflector 200 as it rests/abuts the extension 109. In other embodiments, in order to provide a more versatile device 100, the side member 102 can also be configured to match the design of side member 102 such that either side member can support/interact with similar components/hardware.

In an aspect, the side member 103 extending from the base 104 features a second extension 110 located approximately along one-third the length from the bottom of the side member 103. The second extension 110 intersects perpendicularly with an angled support surface 111. In an aspect, the angled support surface 111 is approximately the same width of the side member 103. In an aspect, the angled flat surface 111 is co-planar to the angled flat surface area 108c. In an aspect, the location of the extension 110 with its angled support surface 111 and the flat surface area 108c are arranged to facilitate wind deflector stability by lowering the wind loads on the wind deflectors. The angled support surface 111 can include a peg/protrusion 111a located at the center of the surface 111; however, the peg/protrusion 111a can be oriented in a variety of locations as deemed desirable. The angled support surface 111 provides a contact area to which a wind deflector 200 (FIG. 2) can rest/abut while being held in place by a peg 111a, with the peg 111a mating with slot 200b (FIG. 2), or any similar structure typically found on wind deflectors or related components, such that the mating of the peg and slot secures the wind deflector in place.

Figure 2:
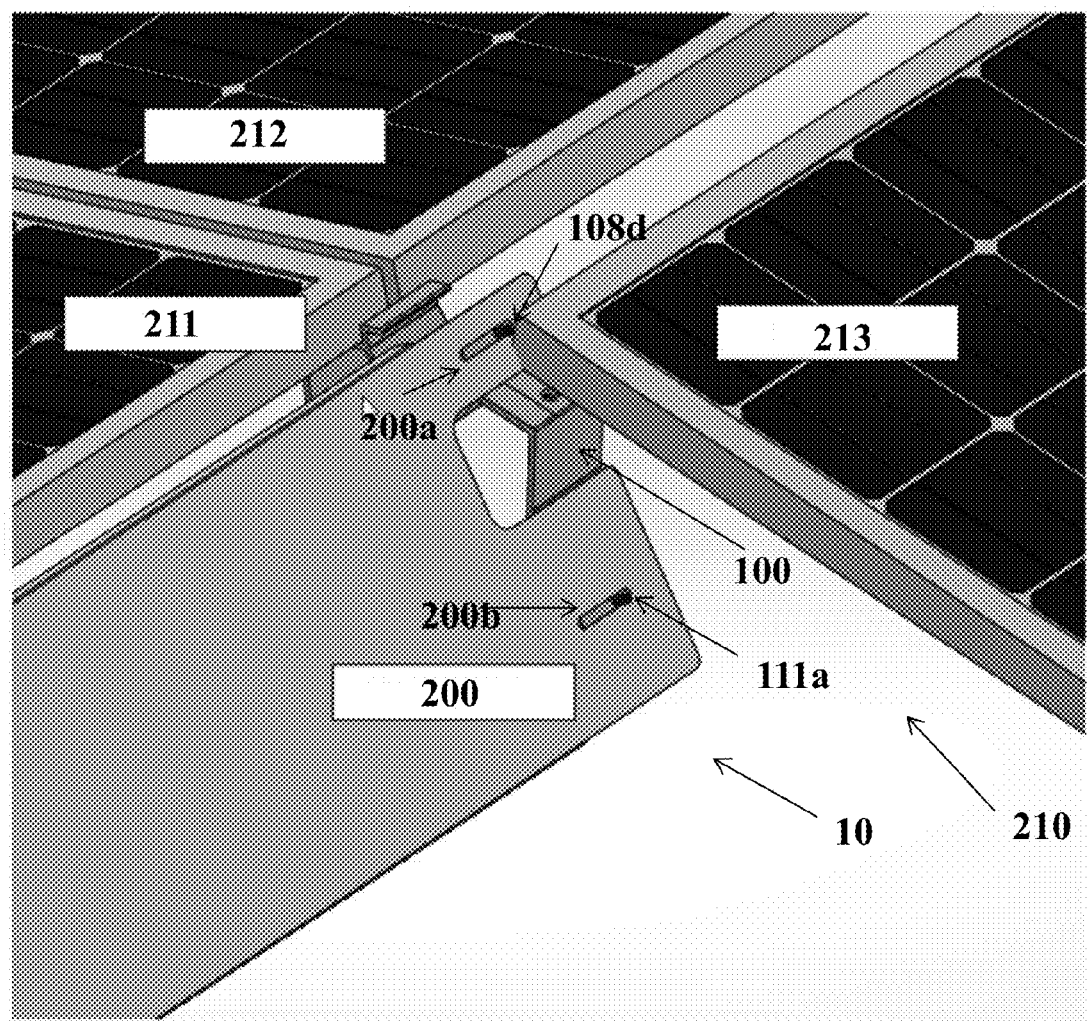
FIG. 2 is a perspective view of an assembly with a wind deflector installed on the structure and support device of FIG. 1 in the middle of a photovoltaic array according to aspects of the present invention.
Figure 3:
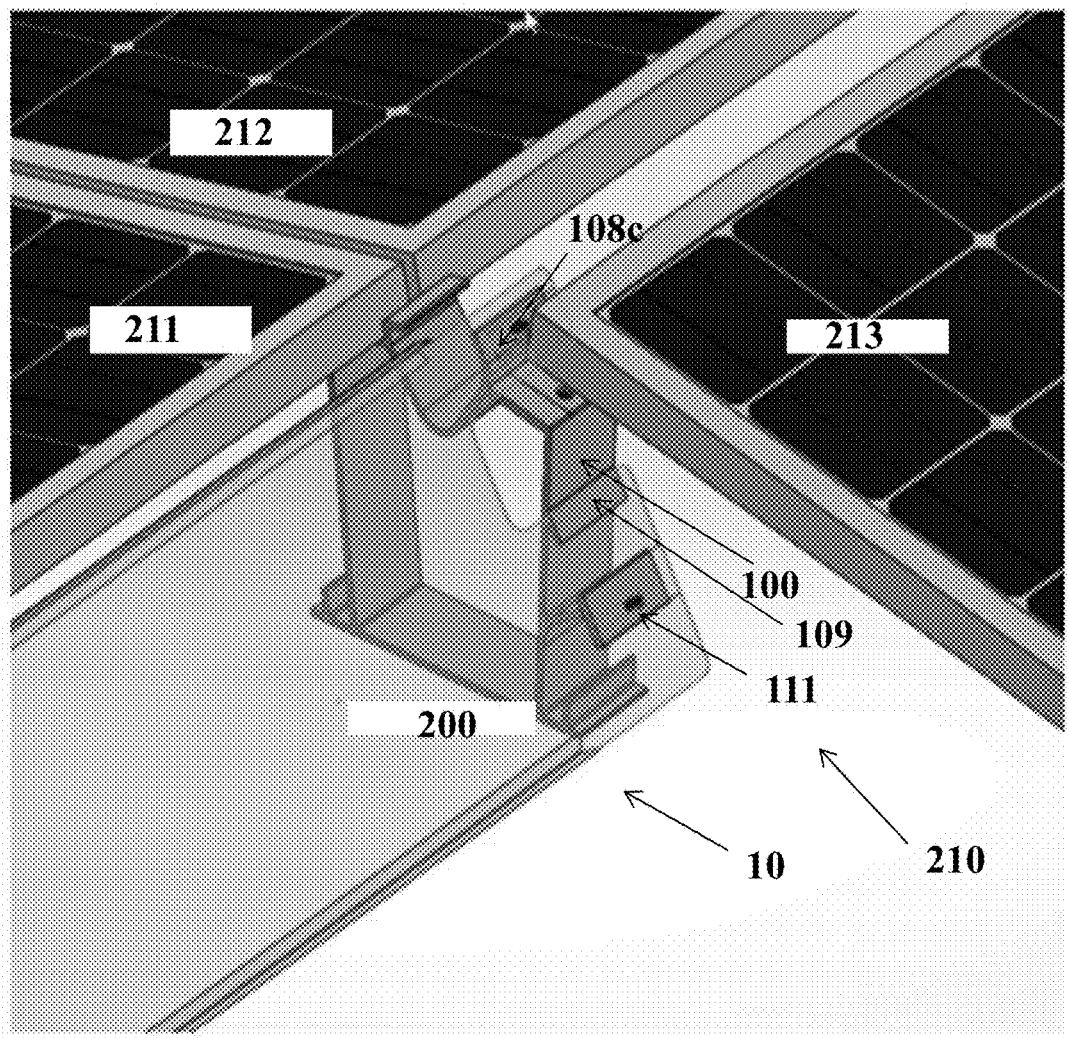
FIG. 3 is a perspective view of a see-through wind deflector and the assembly of FIG. 2.

FIGS. 2-3 illustrate a solar assembly 10 using a structure and support device 100 with a wind deflector 200 installed in the middle of PV array 210 according to aspects of the present invention. The PV array features three PV modules, 211, 212 and 213 interconnected by the structure and support device 100, with a wind deflector 200 installed in an angled fashion. The PV modules 211, 212, and 213 are supported by module interfaces 106a and 107a and the angled protrusions 106 and 107 of the device 100. As discussed above, slots 200a, 200b of the wind deflector 200 can receive pegs/protrusions 108d, 111a that secure the wind deflector 200 on the structure and support device 100. Further, the angled, flat surface area 108c, the rectangular flat-surface extension 109, and the angled support surface 111 provide the support for the wind deflector 200.

Figure 4:
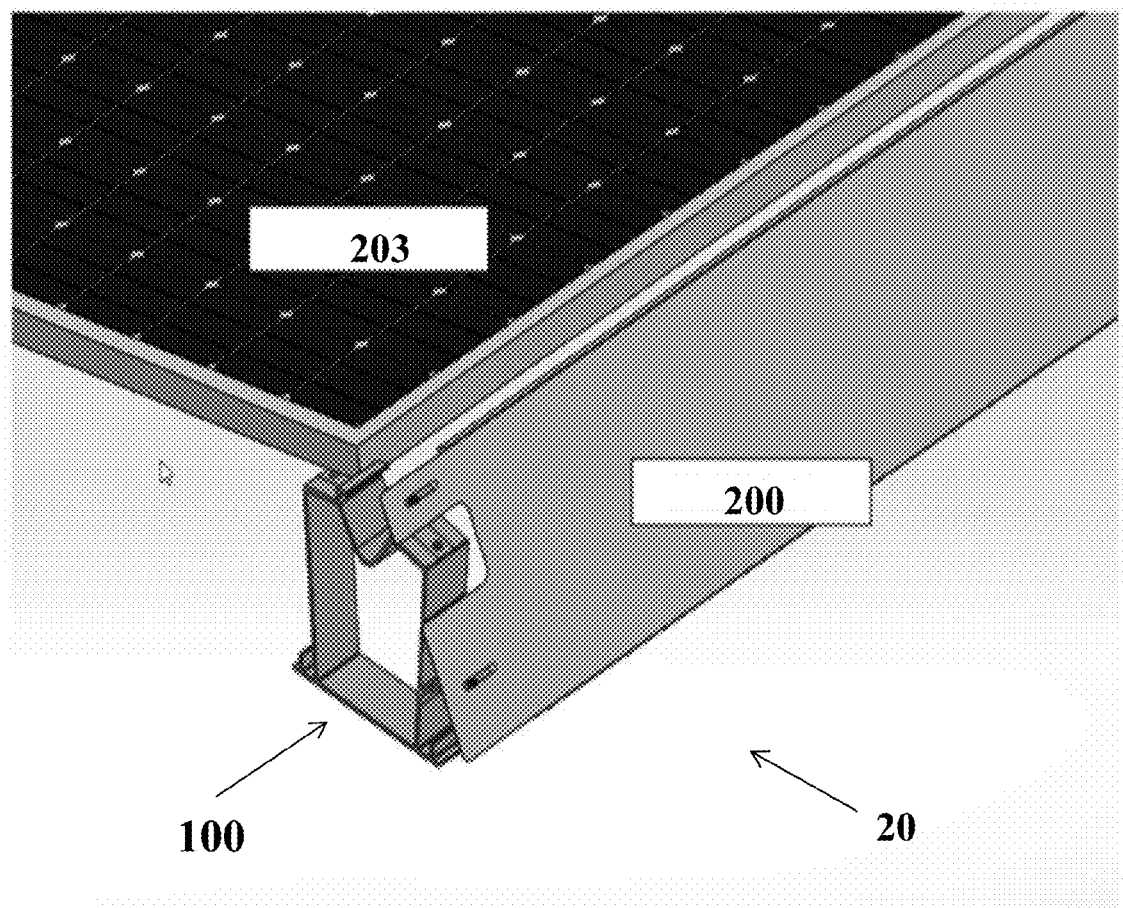
FIG. 4 is a perspective view of a PV array assembly with a wind deflector, the structure and support device of FIG. 1, and a single tilt photovoltaic module according to aspects of the present invention.

FIG. 4 is a PV array assembly 20 with a structure and support device 100, a single tilt photovoltaic module 203 and a wind deflector 200 according to aspects of the present invention. The PV module 203 in a single tilt PV array is generally oriented such that the module 203 is south facing in the northern hemisphere to promote optimal collection of sun radiation energy. As shown, the PV module 203 is supported by a module interface 106a of an angled protrusion 106 of the structure and support device 100. The wind deflector 200 is supported by the flat surface area 108c, the extension 109, and the angled support surface 111.

Figure 5:
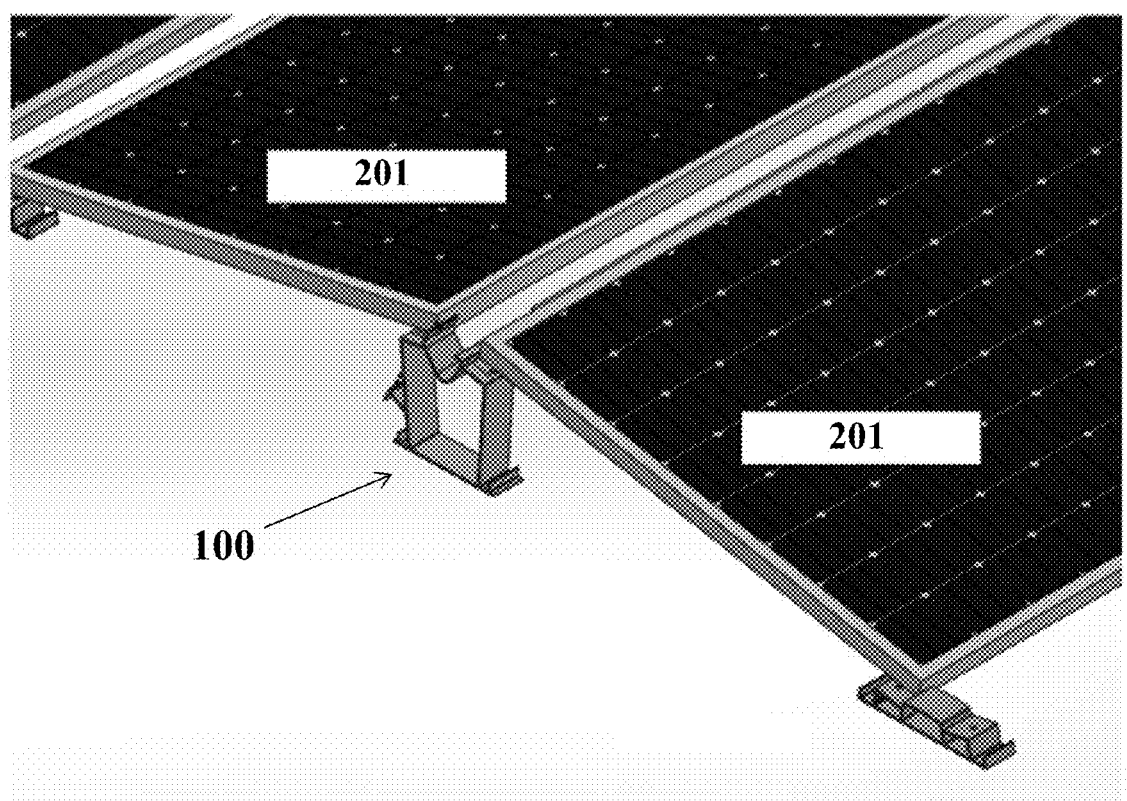
FIG. 5 is a perspective view of a PV array assembly with a wind deflector, the structure and support device of FIG. 1, and two tilted photovoltaic modules according to aspects of the present invention.

FIG. 5 is a PV array assembly with a structure and support device 100, two tilted photovoltaic modules 211 according to aspects of the present invention. The PV modules 201 in a dual tilt PV array 210 are generally oriented such that the modules are east and west facing in the northern hemisphere to promote optimal collection of sun radiation energy. As similarly shown in FIGS. 2-3, the PV modules 201 are supported by the module interfaces 106*a*, 107*a* of the horizontal members 106, 107 of the structure and support device 100.

Figure 6:
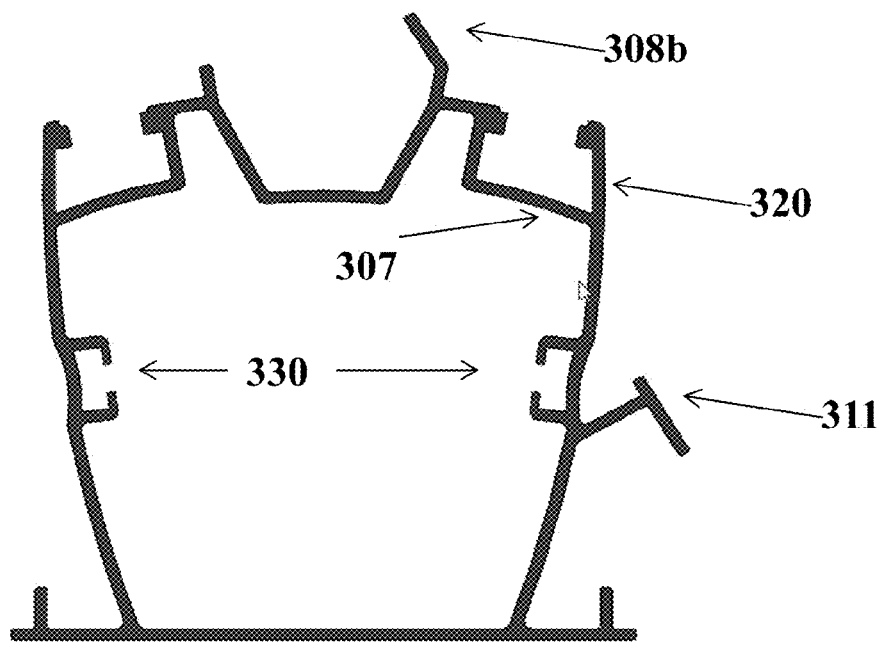
FIG. 6 is a profile view of a structure and support device for PV arrays according to an aspect of the present invention.
Figure 7:
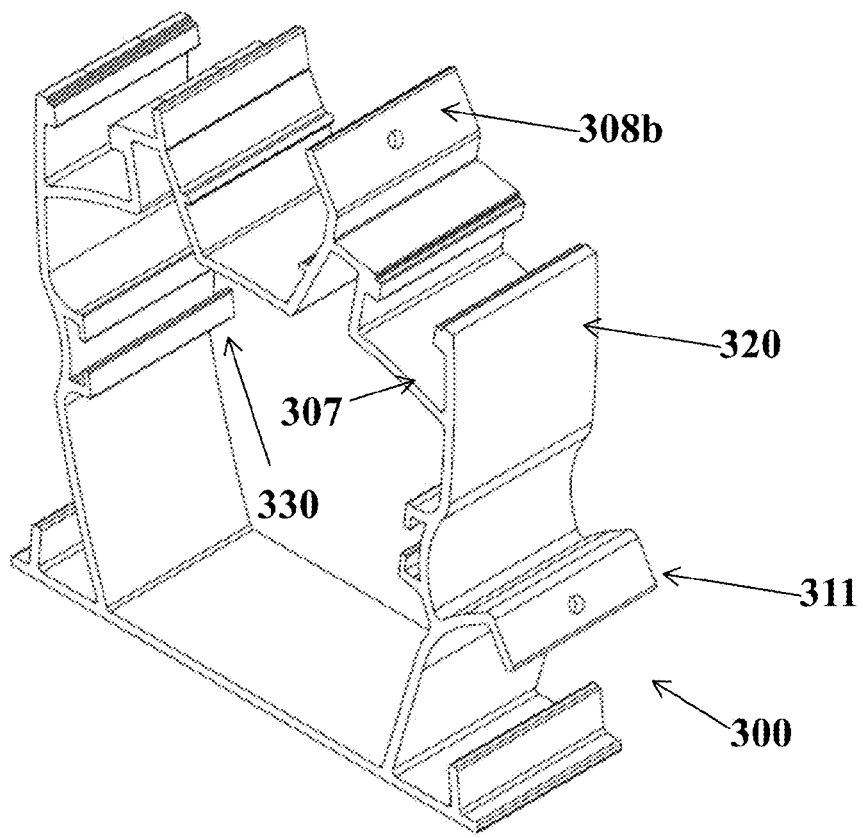
FIG. 7 is a perspective top view of the structure and support device of FIG. 6.

FIGS. 6-7 illustrate another structure and support device 300 according to an aspect of the present invention. The structure and support device 300 includes many of the same components of the structure and support device 100 illustrated in FIGS. 1-4, including the co-planar angled flat surface area 308*b* and angled support surface 311 that is used to support a wind deflector. In addition, a securing flange 320 extends from a top located member 307. The securing flange 320 can provide support for a PV module when attached, or help retain a wind deflector. In addition, interior tabs 330 can be used to hold other accessories.

Having thus described exemplary embodiments of the present invention, it should be noted by those skilled in the art that the disclosures are exemplary only and that various other alternatives, adaptations, and modifications may be made within the scope of the present invention. Accordingly, the present invention is not limited to the specific embodiments as illustrated herein, but is only limited by the following claims.

What is claimed is:

1. A structure and support device for photovoltaic arrays, the device comprising:
   a. a base;
   b. one or more side members extending vertically from the base;
   c. one or more angled surface areas extending from the one or more side members, wherein the one or more angled surface areas are configured to provide contact regions for a photovoltaic module and a wind deflector;
   d. horizontal members extending from the one or more side members;
   e. a substantially V-shaped structure centered in between the horizontal members, the combination of the horizontal members and the substantially V-shaped structure forming a roof of the device, the substantially V-shaped structure comprising arms extending above the horizontal members, wherein the arms of the V-shaped structure are angled in different areas to provide contact regions for the photovoltaic module and the wind deflector; and
   f. protrusions extending from the one or more angled surface areas and the arms of the substantially V-shaped structure, wherein the protrusions are configured to interact with connecting regions on the photovoltaic module and wind deflector to provide a secured connection.

2. The device of claim 1, wherein the connecting regions of the photovoltaic module and wind deflector are slotted areas, wherein the protrusions are configured to interact with the slotted areas.

3. The device of claim 1, wherein the device is formed from aluminum extrusion.

4. The device of claim 1, wherein the device is anodized.

5. The device of claim 1, wherein the device is formed from electrically non-conductive, substantially hard material.

6. A structure and support device for use in a PV array to provide structure and support to PV panels and wind deflectors in multiple combinations, wherein the structure and support device comprises:
   a. a base;
   b. two side members extending from the base, wherein each side member extends vertically upward in a slightly angled fashion from the base and away from one another;
   c. two inward angled members, each member extending from one of the side members; and
   d. a center structure comprising arms extending above the angled members, wherein the formation of the two side members, the two inward angled members and the center structure provide multiple positions for mounting various combinations of the PV modules and the wind deflectors, wherein one arm is configured to provide a contact area for the wind deflectors.

7. The device of claim 6, wherein the base further comprises stabilizers comprising intersecting members used to attach railing components.

8. The device of claim 7, wherein each inward angled member further comprises a module interface providing a surface area configured to abut and restrict movement of PV modules.

9. The device of claim 8, wherein the inward angled members are further configured to stabilize the PV array during installation before permanent attachment.

10. The device of claim 6, wherein the center structure is configured to hold wiring.

11. The device of claim 10, wherein the center structure comprises a V-shape.

12. The device of claim 6, wherein one of the side members comprises a first extension configured to provide support and a contact area to the wind deflectors.

13. The device of claim 12, wherein the one of the side members further comprises a second extension having an angled support surface, wherein the angled support surface and the contact area are co-planar.

14. The device of claim 1, wherein the horizontal members further comprise modular interfaces, the modular interfaces providing a surface area to support the photovoltaic module.

15. The device of claim 1, wherein the substantially V-shaped structure is configured to hold wiring.

16. The device of claim 1, wherein the device is configured to provide support for a first solar assembly with three photovoltaic modules and one wind deflector, a second solar assembly with one photovoltaic module oriented facing south in the northern hemisphere and one wind deflector, and a third solar assembly having two photovoltaic modules aligned in an east to west fashion in the northern hemisphere.

17. A solar assembly comprising:
   e. at least one photovoltaic module or wind deflector; and
   f. a structure and support device comprising:
      i. a base;
      ii. two side members extending vertically from the base, wherein each side member is arranged in a slightly angled fashion from the base and away from one another;
      iii. one or more angled surface areas extending from one of the side members, wherein the one or more angled surface areas are configured to provide contact regions for the wind deflector;
      iv. horizontal members extending from the one or more side members, the horizontal members further comprising module interfaces to provide a surface area to support the photovoltaic module;

v. a substantially V-shaped structure centered in between the horizontal members, the substantially V-shaped structure comprising arms extending above the horizontal members, wherein the arms of the V-shaped structure are angled in different areas to provide contact regions for the photovoltaic module or the wind deflector; and vi. protrusions extending from the one or more angled surface areas and the arms of the substantially V-shaped structure, wherein the protrusions are configured to interact with connecting regions on the photovoltaic module or the wind deflector to provide a secured connection.

18. The solar assembly of claim 17, wherein the at least one photovoltaic module or wind deflector comprises one photovoltaic module and one wind deflector, wherein the structure and support device is configured to support the one photovoltaic module at the module interfaces and the one wind deflector at the contact regions of the arms of the substantially V-shaped structure and the angled surface areas extending from the side members.

19. The solar assembly of claim 18, wherein the at least one photovoltaic module comprises two photovoltaic modules, and wherein the structure and support device is configured to support the two photovoltaic modules at the module interfaces.

* * * * *